US012603611B2

(12) United States Patent
Ipek

(10) Patent No.: US 12,603,611 B2
(45) Date of Patent: Apr. 14, 2026

(54) RADIO FREQUENCY (RF) CIRCUIT INCLUDING MIXER CONFIGURED FOR INDEPENDENT SECOND ORDER INTERCEPT POINT (IP2) CALIBRATION

(71) Applicant: GlobalFoundries U.S. Inc., Malta, NY (US)

(72) Inventor: Mehmet Ipek, Munich (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/678,166

(22) Filed: May 30, 2024

(65) Prior Publication Data

US 2025/0373203 A1 Dec. 4, 2025

(51) Int. Cl.
H03D 7/12 (2006.01)
H03F 3/45 (2006.01)

(52) U.S. Cl.
CPC ........... H03D 7/12 (2013.01); H03F 3/45475 (2013.01); H03F 2200/451 (2013.01)

(58) Field of Classification Search
CPC ........ H03D 7/12; H03D 7/125; H03D 7/1425; H03D 7/1441; H03D 7/1458; H03D 7/1475; H03F 3/45475; H03F 2200/451; G06G 7/12; G06G 7/16
See application file for complete search history.

(56) References Cited

U.S. PATENT DOCUMENTS

| | | | |
|---|---|---|---|
| 6,242,963 B1 | 6/2001 | Su et al. | |
| 7,375,577 B2 | 5/2008 | Lin | |
| 7,554,380 B2 * | 6/2009 | Embabi | H03D 7/1433 327/356 |
| 7,859,270 B2 | 12/2010 | Embabi et al. | |

(Continued)

FOREIGN PATENT DOCUMENTS

CN 101803179 A 8/2010

OTHER PUBLICATIONS

Dufrêne et al., "A Novel IP2 Calibration Method for Low-Voltage Downcoversion Mixers," IEEE Radio Frequency Integrated Circuits (RFIC) Symposium, Jun. 2006, 4 pages.

(Continued)

*Primary Examiner* — Jung Kim
(74) *Attorney, Agent, or Firm* — David Cain; Hoffman Warnick LLC

(57) ABSTRACT

A radio frequency (RF) circuit and associated method include a mixer configured for independent second order intercept point (IP2) calibration. The mixer includes three ports and multiple dual-gate transistors interconnected therebetween for down-converting an RF input signal to a lower frequency baseband output signal. To optimize performance, front gates of the transistors are biased with a front gate bias voltage (Vfg). To adjust second order non-linearity, back gates of the transistors are biased using a first back gate bias voltage (Vbgp) for half of the transistors of the mixer and a second back gate bias voltage (Vbgm) for a different half of the transistors. The circuit can also include a front gate bias (Continued)

voltage generator for generating Vfg and a back gate bias voltage generator (including a digital-to-analog converter (DAC) with multiple DAC units) for generating Vbgp and Vbgm independent of Vfg.

16 Claims, 6 Drawing Sheets

(56) References Cited

U.S. PATENT DOCUMENTS

| | | | |
|---|---|---|---|
| 8,045,944 | B2 | 10/2011 | Zhuo et al. |
| 9,444,559 | B2 | 9/2016 | Jiang et al. |
| 10,014,828 | B1 | 7/2018 | Lee et al. |
| 2009/0075622 | A1 | 3/2009 | Zhuo et al. |
| 2011/0201296 | A1 | 8/2011 | Kaczman et al. |
| 2013/0328707 | A1 | 12/2013 | Choksi et al. |
| 2014/0111252 | A1 | 4/2014 | Zhuo et al. |
| 2022/0085761 | A1 | 3/2022 | Han et al. |

OTHER PUBLICATIONS

Kaczman et al., "A Single-Chip 10-Band WCDMA/HSDPA 4-Band GSM/EDGE SAW-less CMOS Receiver With DigRF 3G Interface and +90 dBm IIP2," IEEE Journal of Solid-State Circuits, vol. 44, No. 3, Mar. 2009, pp. 718-739.
Han et al., "A SAW-Less Receiver Front-End Employing Body-Effect Control IIP2 Calibration," IEEE Transactions on Circuits and Systems—I: Regular Papers, vol. 61, No. 9, Sep. 2014, 8 pages.
European Search Report for corresponding EP Application No. 24212255.4-1201 dated Jul. 31, 2025, 15 pages.
European Search Report for corresponding EP Application No. 24212255.4-1201 dated May 19, 2025, 15 pages.

* cited by examiner

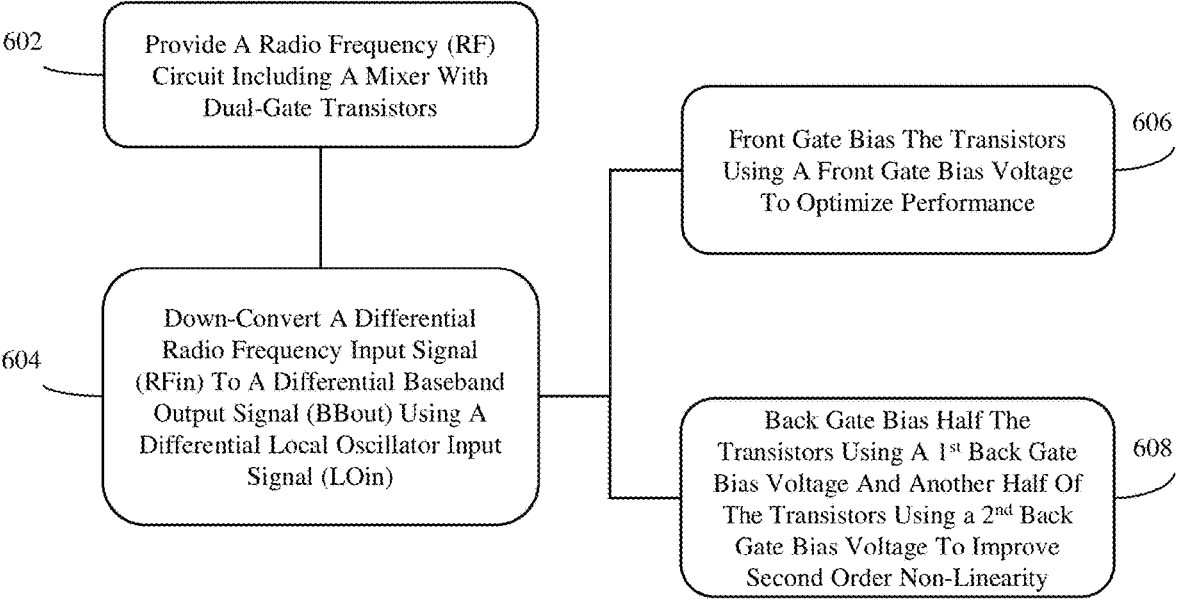

602 — Provide A Radio Frequency (RF) Circuit Including A Mixer With Dual-Gate Transistors 604 — Down-Convert A Differential Radio Frequency Input Signal (RFin) To A Differential Baseband Output Signal (BBout) Using A Differential Local Oscillator Input Signal (LOin)

606 — Front Gate Bias The Transistors Using A Front Gate Bias Voltage To Optimize Performance 608 — Back Gate Bias Half The Transistors Using A 1$^{st}$ Back Gate Bias Voltage And Another Half Of The Transistors Using a 2$^{nd}$ Back Gate Bias Voltage To Improve Second Order Non-Linearity

FIG. 6

RADIO FREQUENCY (RF) CIRCUIT INCLUDING MIXER CONFIGURED FOR INDEPENDENT SECOND ORDER INTERCEPT POINT (IP2) CALIBRATION

BACKGROUND

The present disclosure relates to radio frequency (RF) circuits and, more particularly, to embodiments of an RF circuit including a mixer that receives various bias voltages for improved performance and second order non-linearity and an associated operating method.

RF applications, including millimeter wave (mmWave) (e.g., 3-300 GHz) wireless applications, often include RF mixers. For example, in an RF receiver, a down-conversion mixer can be employed to down-convert a received high-frequency differential RF input signal (RFin) to a low-frequency differential baseband output signal (BBout) (also referred to as a differential intermediate frequency output signal (IFout)). Typically, a down-conversion mixer will include an RF input port for receiving RFin, a local oscillator (LO) input port for receiving a differential local oscillator input signal (LOin) employed to change RFin to BBout, and a baseband (BB) output port for outputting BBout. The down-conversion mixer can include multiple (e.g., four) transistors interconnected between these ports. For optimal mixer performance (e.g., to achieve an optimal LO switching point, etc.), a gate bias voltage (Vg) is selected to control the transistors. For improved second order non-linearity (e.g., for mixer balancing), second order intercept point (IP2) calibration is performed through this Vg. IP2 refers to a measure of linearity that quantifies second-order distortion generated by nonlinear systems. IP2 calibration can be performed to mitigate the effects of second-order intermodulation distortion (IMD2) (i.e., to improve second-order non-linearity). In a mixer, IP2 calibration is typically accomplished using a programmable offset ($\Delta V$) for Vg.

SUMMARY

Disclosed herein are embodiments of a radio frequency (RF) circuit. The RF circuit can include a mixer. The mixer can include multiple transistors including a first transistor connected between a first input node and an output node and a second transistor connected between an additional first input node and the output node. The multiple transistors can further include a third transistor connected between the first input node and an additional output node and a fourth transistor connected between the additional first input node and the additional output node. Within the mixer, a first front gate of the first transistor, a second front gate of the second transistor, a third front gate of the third transistor, and a fourth front gate of the fourth transistor can be connected to receive a front gate bias voltage. Furthermore, a first back gate of the first transistor and a second back gate of the second transistor can be connected to receive a first back gate bias voltage and a third back gate of the third transistor and a fourth back gate of the fourth transistor can be connected to receive a second back gate bias voltage.

Some embodiments of an RF circuit disclosed herein can, more specifically, include a front gate bias voltage generator that outputs a front gate bias voltage and a back gate bias voltage generator that outputs both a first back gate bias voltage and a second back gate vias voltage. The RF circuit can further include a mixer including multiple transistors. The multiple transistors can include a first transistor connected between a first input node and an output node and a second transistor connected between an additional first input node and the output node. The multiple transistors can further include a third transistor connected between the first input node and an additional output node and a fourth transistor connected between the additional first input node and the additional output node. Within the RF circuit, a first front gate of the first transistor, a second front gate of the second transistor, a third front gate of the third transistor, and a fourth front gate of the fourth transistor can be connected to receive the front gate bias voltage. A first back gate of the first transistor and a second back gate of the second transistor can be connected to receive the first back gate bias voltage. A third back gate of the third transistor and a fourth back gate of the fourth transistor can be connected to receive the second back gate bias voltage. In such an RF circuit, the first back gate bias voltage and the second back gate bias voltage can be programmable to adjust second order non-linearity of the mixer.

Also disclosed herein are operating methods associated with such an RF circuit. More particularly, the method can include providing an RF circuit including a mixer. The mixer can include multiple transistors and these transistors can all be dual-gated. The method can further include operating the mixer and, particularly, during mixer operation, front gate biasing all of the transistors with a front gate bias voltage and back gate biasing half the transistors using a first back gate bias voltage and a different half of the transistors using a second back gate bias voltage. In this method, the first back gate bias voltage and the second back gate bias voltage can specifically be programmable to adjust second order non-linearity of the mixer.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 6 is a flow diagram illustrating embodiments of a disclosed operating method.

Figure 1:
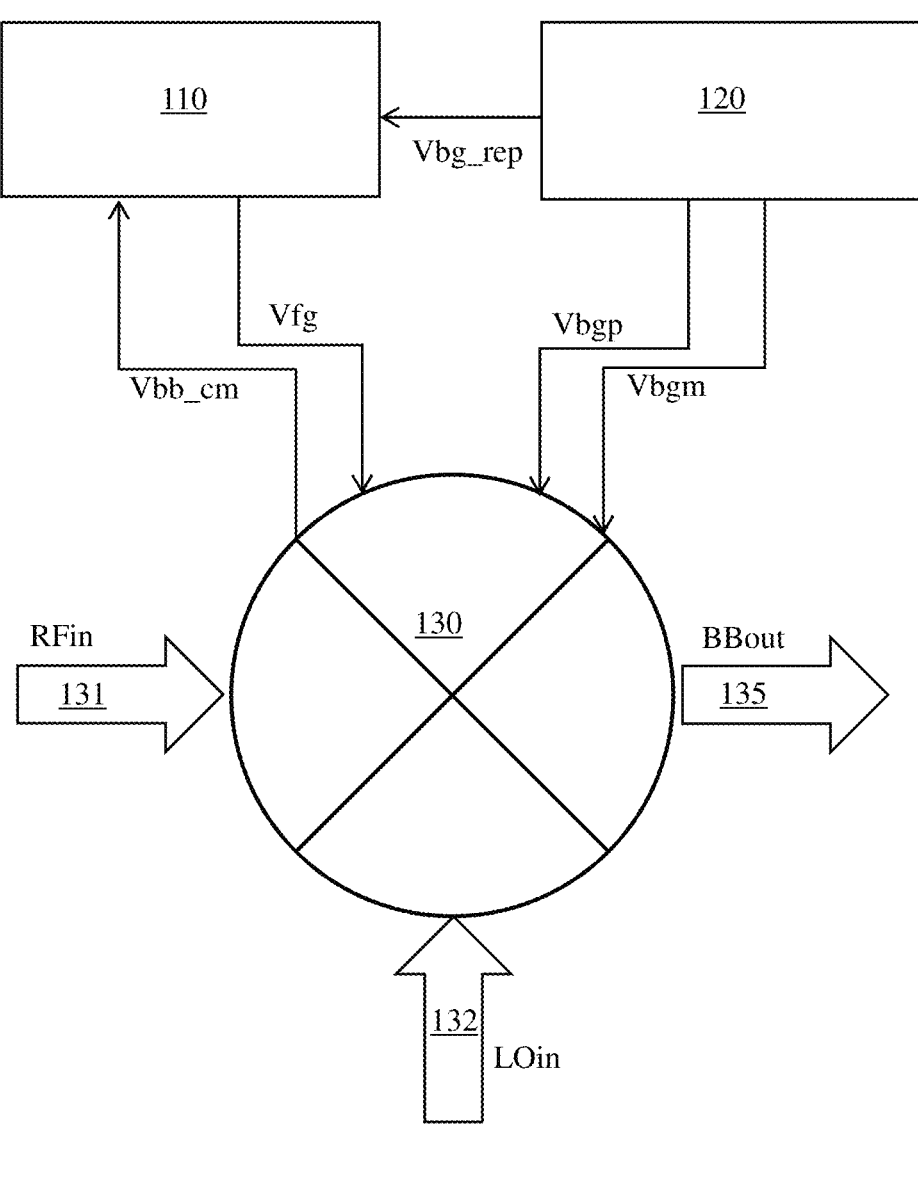
FIG. 1 is a schematic drawing illustrating disclosed RF circuit embodiments.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

DETAILED DESCRIPTION

As mentioned above, RF applications, including millimeter wave (mmWave) (e.g., 3-300 GHz) wireless applications, often include RF mixers. For example, in an RF receiver, a down-conversion mixer can be employed to down-convert a received high-frequency differential RF input signal (RFin) to a low-frequency differential baseband output signal (BBout) (also referred to as a differential intermediate frequency output signal (IFout)). Typically, a down-conversion mixer will include an RF input port for receiving RFin, a local oscillator (LO) input port for receiving a differential local oscillator input signal (LOin) employed to change RFin to BBout, and a baseband (BB) output port for outputting BBout. The down-conversion mixer can include multiple (e.g., four) transistors interconnected between these ports. For optimal mixer performance (e.g., to achieve an optimal LO switching point, etc.), a gate bias voltage (Vg) is selected to control the transistors. For improved second order non-linearity (e.g., for mixer balancing), second order intercept point (IP2) calibration is performed through this Vg. IP2 refers to a measure of linearity that quantifies second-order distortion generated by nonlinear systems. IP2 calibration can be performed to mitigate the effects of second-order intermodulation distortion (IMD2) (i.e., to improve second-order non-linearity). In a mixer, IP2 calibration is typically accomplished using a programmable offset voltage ($\Delta V$) for Vg.

Disclosed herein are embodiments of an RF circuit including a mixer configured for independent IP2 calibration and, particularly, configured for IP2 calibration performed independently of (i.e., decoupled from) gate biasing for performance optimization. Specifically, the mixer includes a differential radio frequency input port, a differential local oscillator input port, and a differential baseband output port. The mixer further includes multiple (e.g., four) dual-gate transistors interconnected between the ports to enable down-converting of a high-frequency differential radio frequency input signal to a low-frequency differential baseband output signal (also referred to herein as a differential intermediate frequency output signal). To optimize performance (e.g., to achieve an optimal LO switching point, etc.), front gates of the dual-gate transistors can be biased with the same specific front gate bias voltage (Vfg). To improve second order non-linearity (i.e., to provide IP2 calibration for mixer balancing), the back gates of half of the transistors of the mixer can receive a first back gate bias voltage (Vbgp) and the back gates of the other half can receive a second back gate bias voltage (Vbgm). The RF circuit can further include a front gate bias voltage generator for generating Vfg and a back gate bias voltage generator (e.g., including a digital-to-analog converter (DAC) with multiple DAC units) for generating Vbgp and Vbgm independent of Vfg. It should be noted that the unique configuration of the mixer may also consume less area than known mixers because fewer capacitors are required (as discussed in greater detail below). Also disclosed herein are embodiments of an associated operating method.

More particularly, referring to FIG. 1 disclosed herein are embodiments of an RF circuit 100. RF circuit 100 can include a mixer 130. Mixer 130 can be a down-conversion mixer (also referred to herein as a downconverter). Mixer 130 can include three differential ports including: a differential radio frequency input port 131 (RFin port), a differential local oscillator input port 132 (LOin port), and a differential baseband output port 135 (BBout port) (also referred to herein as a differential intermediate frequency output port). RFin port 131 can be connected to receive a differential radio frequency input signal (RFin) and LOin port 132 can be connected to receive a differential local oscillator input signal (LOin). Mixer 130 can further use LOin (i.e., can be configured to use LOin) to down-convert RFin into a low-frequency differential baseband output signal (BBout), which is output at BBout port 135. As discussed in greater detail below and illustrated through FIGS. 2-3, to achieve this down-conversion, mixer 130 can include multiple transistors and, particularly, multiple dual-gated N-channel field effect transistors (NFETs) interconnected between the ports 131, 132, and 135. These dual-gated NFETs can each have two independently biasable gates including a front gate (also referred to herein as a primary gate) and a back gate (also referred to herein as a secondary gate) opposite the front gate.

RF circuit 100 can further include a front gate bias voltage generator 110. Front gate bias voltage generator 110 can generate and output a front gate bias voltage (Vfg) (i.e., can be configured to generate and output Vfg) for biasing the front gates of the dual-gated NFETs. RF circuit 100 can also include a back gate bias voltage generator 120. Back gate bias voltage generator 120 can generate and output first and second back gate bias voltages (Vbgp and Vbgm) (i.e., can be configured to generate and output Vbgp and Vbgm) that are independent of Vfg for biasing the back gates of the dual-gated NFETs. As discussed in greater detail below, Vbgp and Vbgm can be programmable in order to achieve a specific voltage offset ($\Delta V$)=Vbgp−Vbgm. Back gate bias voltage generator 120 can further generate and output an additional back gate bias voltage (Vbg_rep) specifically for back gate biasing a replica transistor included in front gate bias voltage generator 110.

Figure 2:
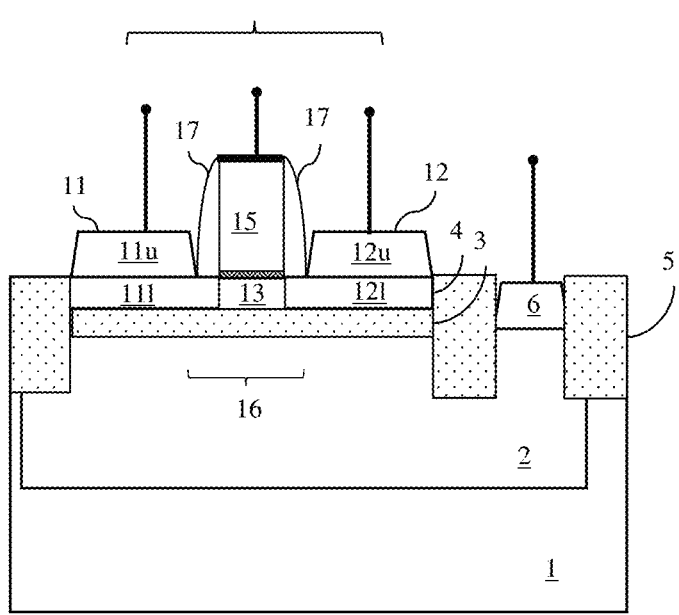
FIG. 2 is a cross-section diagram illustrating an example of a dual-gated transistor that could be incorporated into a mixer of the RF circuit of FIG. 1.

FIG. 2 is a cross-section diagram illustrating an example of a dual-gated NFET 10 that could be incorporated into mixer 130. Dual-gated NFET 10 can be formed using an advanced semiconductor-on-insulator technology processing platform. For example, this dual-gated NFET can be a semiconductor-on-insulator NFET (e.g., silicon-on-insulator (SOI) NFET), such as either a fully-depleted semiconductor-on-insulator NFET (e.g., a fully-depleted SOI (FDSOI) NFET) or a partially-depleted semiconductor-on-insulator NFET (e.g., a partially-depleted SOI (PDSOI) NFET).

For example, a semiconductor substrate 1 can be, for example, a monocrystalline silicon substrate or, alternatively, a monocrystalline substrate of any other suitable semiconductor material (e.g., silicon germanium, etc.). An insulator layer 3 can be on the top surface of semiconductor substrate 1. Insulator layer 3 can be, for example, a silicon dioxide layer or a layer of any other suitable insulator material. A semiconductor layer 4 can be on the top surface of insulator layer 3. Semiconductor layer 4 can be, for example, a monocrystalline silicon layer or a layer of any other suitable monocrystalline semiconductor material (e.g., silicon germanium, etc.).

Trench isolation regions 5 (e.g., shallow trench isolation (STI) structures) can define an active device region for NFET 10 within semiconductor layer 4. Such STI structures can include, for example, one or more trenches patterned (e.g., lithographically) and etched so as to extend vertically from the top surface of semiconductor layer 4 to and, optionally, through insulator layer 3 and further so as to surround an active device region within semiconductor layer 4. The trench(es) can be filled with one or more layers of isolation materials (e.g., silicon dioxide, silicon nitride, silicon oxynitride, etc.), thereby forming the STI structures.

Dual-gated NFET 10 can include, within its active device region, a channel region 13 positioned laterally between a source region 11 and a drain region 12. Source/drain regions 11-12 can have N-type conductivity at a relatively high conductivity level (e.g., N+ source/drain regions). Source/drain regions 11-12 can include lower source/drain portions 11*l*-12*l* including doped regions of semiconductor layer 4 on either side of channel region 13. Optionally, source/drain regions 11-12 can further include upper source/drain portions 11*u*-12*u* (also referred to herein as raised source/drain regions) above and immediately adjacent to lower source/drain portions 11*l*-12*l*, respectively. Upper source/drain portions 11*u*-12*u* can include epitaxially grown monocrystalline semiconductor layers (e.g., epitaxially grown silicon layers). In any case, channel region 13 can be a portion of semiconductor layer 4, which is positioned laterally between the N+ source/drain regions, and which is intrinsic (i.e., undoped) or doped so as to have P-type conductivity at a relatively low conductivity level (e.g., so as to be a P-channel region).

Dual-gated NFET 10 can further include a front gate 15 (also referred to herein as a primary gate) adjacent to (e.g., above, and immediately adjacent to) the active device region at channel region 13. Front gate 15 can include a gate dielectric layer (including one or more layers of gate dielectric material) immediately adjacent to channel region 13 and a gate conductor layer (including one or more layers of gate conductor material) on the gate dielectric layer. Front gate 15 could be any of a gate-first polysilicon gate structure, a gate-first high-K metal gate (HKMG) structure, a gate-last HKMG structure (also referred to as a replacement metal gate (RMG) structure), or any other suitable type of front gate structure. Gate sidewall spacers 17 can further be positioned laterally adjacent to sidewalls of front gate 15 to electrically isolate it from the adjacent source/drain regions 11-12. Front gate structures with gate sidewall spacers are well known in the art and, thus, the details thereof have been omitted from the specification in order to allow the reader to focus on the salient aspects of the disclosed embodiments.

Dual-gated NFET 10 can further include a back gate 16 (also referred to herein as a secondary gate). Specifically, semiconductor substrate 1 can include a well region 2 therein. Well region 2 can be located at the top surface of semiconductor substrate 2 immediately adjacent insulator layer 3 and can further be aligned below the active device region. For purposes of this disclosure, a well region refers to a region of semiconductor material doped (e.g., via a dopant implantation process or any other suitable doping process) so as to have a particular conductivity type.

Those skilled in the art will recognize that one advantage of advanced semiconductor-on-insulator technology processing platforms is that FETs can be formed on an insulator layer above either a particular type of well region (e.g., an N-type well region (Nwell) or a P-type well region (Pwell)) in order to achieve different types of NFETs or PFETs with different threshold voltages (VTs). For example, for a super low threshold voltage (SLVT) or low threshold voltage (LVT) FET, an NFET can be formed above an Nwell and a PFET can be formed above a Pwell. For a regular threshold voltage (RVT) or high threshold voltage (HVT) FET, an NFET can be formed above a Pwell and a PFET can be formed above an Nwell. Typically, a circuit block will include all SLVT (or LVT) FETs with NFETs above Nwells and PFETs above Pwells or all RVT (or HVT) FETs with NFETs above Pwells and PFETs above Nwells. Whether the FETs are SLVT or LVT FETs or whether they are RVT or HVT FETs will depend upon the design (e.g., device size, etc.) and process specifications (e.g., dopant concentrations, etc.). NFET 10 will be an SLVT NFET and an LVT NFET if well region 2 is an Nwell; whereas NFET 10 will be an RVT NFET or an HVT NFET if well region 2 is a Pwell.

Another advantage of advanced semiconductor-on-insulator technology processing platforms is that portions of the insulator layer and well regions aligned below a FET effectively form a back gate, which can be biased (referred to as back gate biasing or back-biasing) to fine tune the threshold voltage. Forward back-biasing (FBB) refers to applying a gate bias voltage to the back gate (particularly, to the well region thereof) to reduce the VT of the FET. Reverse back-biasing (RBB) refers specifically to applying a gate bias voltage to the back gate (particularly, to the well region thereof) to increase the VT of the FET, thereby decreasing the switching speed and reducing leakage current. Thus, in dual-gated NFET 10, portions of insulator layer 3 and well region 2 aligned below channel region 13 effectively form back gate 16. In some embodiments, disclosed herein the well region 2 can be an Nwell. To facilitate back gate biasing, dual-gated NFET 10 can include a well contact region 6 (also referred to herein as a well tap). Specifically, the structure can further include a bulk region (also referred to as a hybrid region). This bulk region can be devoid of insulator layer 3 and instead can include well contact region 6 at the top surface of semiconductor substrate 1 immediately adjacent to well region 2 and electrically isolated from the active device region of by STI structures. Well contact region 6 can include, for example, an epitaxial monocrystalline semiconductor layer (e.g., an epitaxial silicon layer or an epitaxial layer of any other suitable semiconductor material), which is grown on the top surface of semiconductor substrate 1 immediately adjacent to well region 2 and either in situ doped or subsequently implanted so as to have the same type conductivity (e.g., N-type conductivity) but at a higher conductivity level. Alternatively, well contact region 6 could be a highly doped region within and at the top surface of well region 2. Given the above-described structure, front gate 15 and back gate 16 of NFET 10 are independently biasable. That is, they can be biased with the same or different bias voltages.

It should be understood that the example dual-gated NFET shown in FIG. 2 is just one type of dual-gated NFET that could be incorporated into mixer 130. Alternatively, any other type of dual-gated NFET having independently biasable front and back gates (i.e., primary and secondary gates) could be incorporated into mixer 130. For example, alternatively, a non-planar dual-gated NFET, such as an N-channel fin-type field effect transistor (FinFET) with independently biasable gates on opposing sides of a semiconductor fin, could be incorporated into mixer 130.

Figure 3:
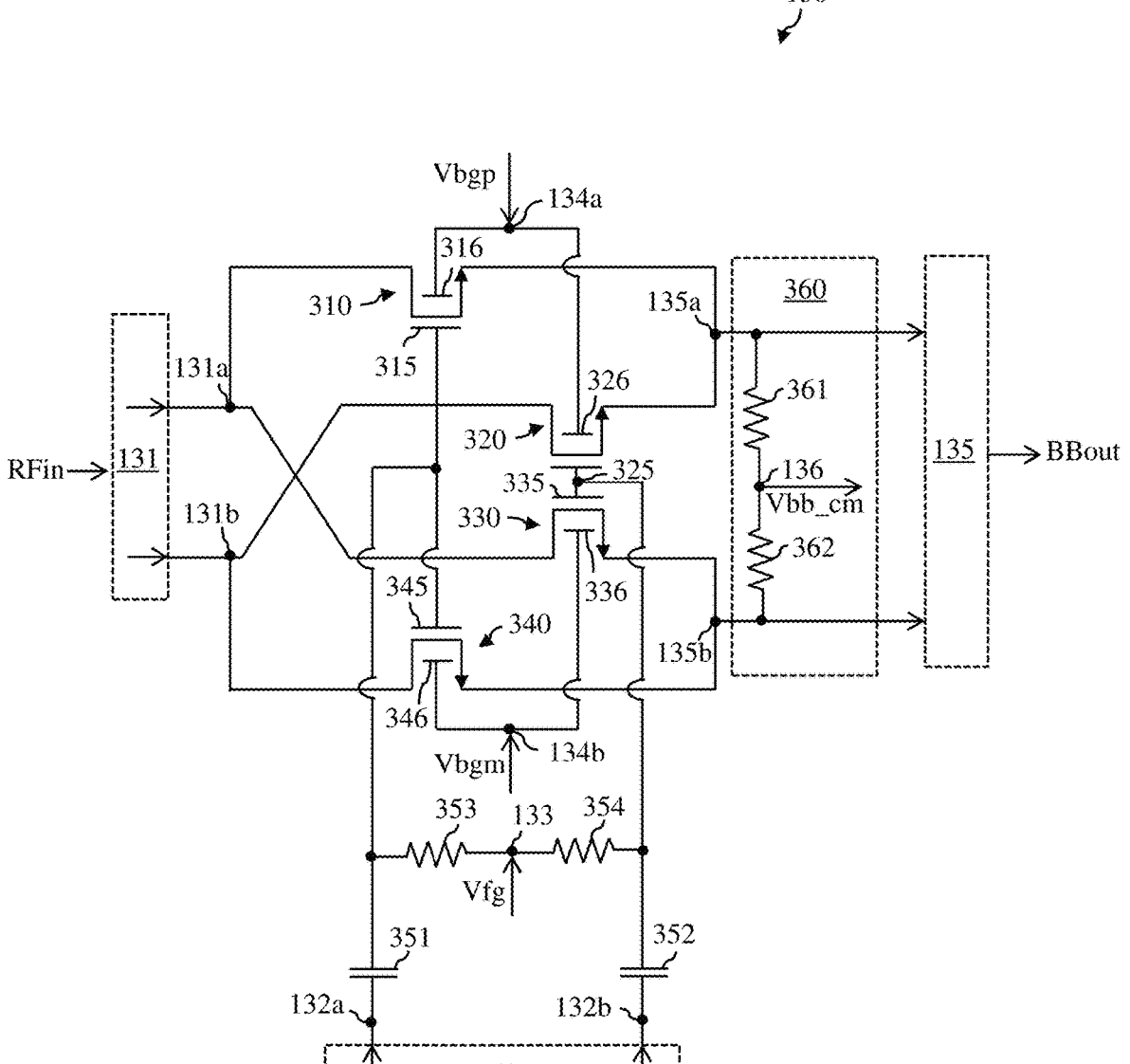
FIG. 3 is a schematic diagram illustrating an example of a mixer that can be incorporated into the RF circuit of FIG. 1.

FIG. 3 is a schematic diagram illustrating an example of a mixer that could be incorporated into the RF circuit 100. Referring to FIG. 3 in combination with FIGS. 1 and 2, mixer 130 can include RFin port 131, LOin port 132, and BBout port 135 as well as four dual-gated NFETs 310, 320, 330, 340 interconnected between the ports 131, 132 and 135. More specifically, mixer 130 can include: a first input node 131*a* and an additional first input node 131*b* connected to RFin port 131; a second input node 132a and an additional second input node 132b connected to LOin port 132; and an output node 135a and an additional output node 135b connected to BBout port 135.

The dual-gated NFETs can include a first transistor 310 (i.e., a first dual-gated NFET). First transistor 310 can include: first source/drain regions, which are connected to first input node 131a and output node 135a; respectively; a first channel region between the first source/drain regions; and independently biasable first front and back gates 315 and 316 adjacent to opposing sides of the first channel region. The dual-gated NFETs can further include a second transistor 320 (i.e., a second dual-gated NFET). Second transistor 320 can include: second source/drain regions, which are connected to additional first input node 131b and output node 135a, respectively; a second channel region between the second source/drain regions; and independently biasable second front and back gates 325 and 326 adjacent to opposing sides of the second channel region. The dual-gated NFETs can further include a third transistor 330 (i.e., a third dual-gated NFET). Third transistor 330 can include: third source/drain regions, which are connected to first input node 131a and additional output node 135b; respectively; a third channel region between the third source/drain regions; and independently biasable third front and back gates 335 and 336 adjacent to opposing sides of the third channel region. The dual-gated NFETs can further include a fourth transistor 340 (i.e., a fourth dual-gated NFET). Fourth transistor 340 can include: fourth source/drain regions, which are connected to additional first input node 131b and additional output node 135b, respectively; a fourth channel region between the fourth source/drain regions; and independently biasable fourth front and back gates 345 and 346 adjacent to opposing sides of the second channel region.

For performance optimization (e.g., for optimizing the LO switching point of mixer 130, etc.) front gates of dual-gated NFETs 310, 320, 330, 340 can all be electrically connected to receive the same front gate bias voltage (Vfg). Specifically, mixer 130 can include a front gate bias voltage node 133, which is electrically connected to receive Vfg (e.g., from a front gate bias voltage generator 110, as discussed below and illustrated in greater detail in FIG. 5). First front gate 315 of first transistor 310 and fourth front gate 345 of fourth transistor 340 can be electrically connected (e.g., via resistor 353) to front gate bias voltage node 133. Similarly, second front gate 325 of second transistor 320 and third front gate 335 of third transistor 330 can be electrically connected (e.g., via resistor 354) to front gate bias voltage node 133. Thus, first front gate 315 of first transistor 310, second front gate 325 of second transistor 320, third front gate 335 of third transistor 320, and fourth front gate 345 of fourth transistor 340 are all electrically connected to receive Vfg. It should be noted that no voltage offset is employed for front gate biasing of dual-gated NFETs 310, 320, 330, 340 within mixer 130.

For improving second-order non-linearity (e.g., for mixer balancing), IP2 calibration can be performed through back-biasing of dual-gated NFETs 310, 320, 330, 340 using a programmable voltage offset (ΔV). More particularly, mixer 130 can further include a pair of back gate bias voltage input nodes 134a and 134b, which are electrically connected to receive a pair of programmable back gate bias voltages, respectively. The programmable back gate bias voltages can be received from a back gate bias voltage generator 120 and can include, but are not limited to, a first back gate bias voltage (Vbgp) and a second back gate bias (Vbgm) to achieve a specific voltage offset (ΔV)=Vbgp–Vbgm (e.g., as discussed below and illustrated in greater detail in FIG. 4).

Back gate bias voltage input node 134a can further be electrically connected to first back gate 316 of first transistor 310 and to second back gate 326 of second transistor 320, whereas back gate bias voltage input node 134b can further be electrically connected to third back gate 336 of third transistor 330 and to fourth back gate 346 of fourth transistor 340. Thus, half the transistors within the mixer 130 have back gates connected to receive Vbgp and the other half have back gates connected to receive Vbgm. That is, first back gate 316 of first transistor 310 and second back gate 326 of second transistor 320 are electrically connected to receive Vbgp, whereas third back gate 336 of third transistor 330 and fourth back gate 346 of fourth transistor 340 are electrically connected to receive Vbgm. As discussed in greater detail below, Vbgp and Vbgm are specifically programmable to achieve mixer balancing.

Mixer 130 can further include a pair of decoupling capacitors: including a first capacitor 351 and a second capacitor 352. First capacitor 351 can include first capacitor plates (one electrically connected to second input node 132a and the other electrically connected to both first front gate 315 of first transistor 310 and fourth front gate 345 of fourth transistor 340) and a capacitor dielectric between the first capacitor plates. Second capacitor 352 can include second capacitor plates (one electrically connected to additional second input node 132b and the other electrically connected to both second front gate 325 of second transistor 320 and third front gate 335 of third transistor 330) and a capacitor dielectric between the second capacitor plates.

Mixer 130 can further include a voltage divider 360. Voltage divider 360 can include a pair of resistors 361-362 connected in series between output node 135a and additional output node 135b. Voltage divider 360 can further include a common mode baseband voltage output node 136 at the junction between the resistors 361-362.

In operation, differential RF input port 131 can receive RFin and can further apply complementary RF input signals (RFin+ and RFin−) of RFin to first input node 131a and additional first input node 131b, respectively. Differential LO input port 132 can receive LOin (e.g., from a local oscillator (not shown)) and can further apply complementary LO input signals (LOin+ and LOin−) of LOin to second input node 132a and additional second input node 132b, respectively. LOin could be at a different frequency (e.g., lower or higher) than RFin or even at the same frequency as RFin. Various local oscillators capable of generating LOin are well known in the art and, thus, the details thereof have been omitted from this specification in order to allow the reader to focus on the salient aspects of the disclosed embodiments.

In response to the complementary RF input signals at nodes 131a-131b and complementary LO input signals at nodes 132a-132b and, given the combination of front and back gate biasing described above, complementary BB output signals (BBout+ and BBout−) can be generated on output node 135a and additional output node 135b, respectively. The frequency of BBout (BBout+ and BBout−) will depend on the difference between the frequencies of RFin (RFin+ and RFin−) and LOin (LOin+ and LOin−). BBout+ and BBout− can further be received by differential BB output port 135 and differential BB output port 135 can output a differential BBout. In other words, mixer 130 will effectively function to combine the RF signal with the LO signal so as to translate the RF signal to a low frequency BB signal, which can be easily processed by subsequent stages connected to receive the low frequency BB signal. Those skilled in the art will recognize that, mathematically, this process can be described by the following equation: f_BB=|f_LO−f_RF|. Furthermore, given BBout+ and BBout−, voltage divider 360 can generate and output a common mode baseband voltage (Vbb_cm) at the common mode baseband voltage output node 136.

In mixer 130 described above, performance optimization and IP2 calibration are effectively decoupled by employing a combination of both front gate biasing and back gate biasing to improve control over both processes. Furthermore, the unique configuration of mixer 130 may also consume less area than known mixers. Specifically, fewer decoupling capacitors (e.g., only two decoupling capacitors 351-352 as opposed to four) are needed because only Vfg (and not a pair of front gate bias voltages with voltages offsets) needs to be decoupled from LOin+ and LOin−. Since there are fewer decoupling capacitors with mixer 130, mixer 130 takes up less chip area.

Figure 4:
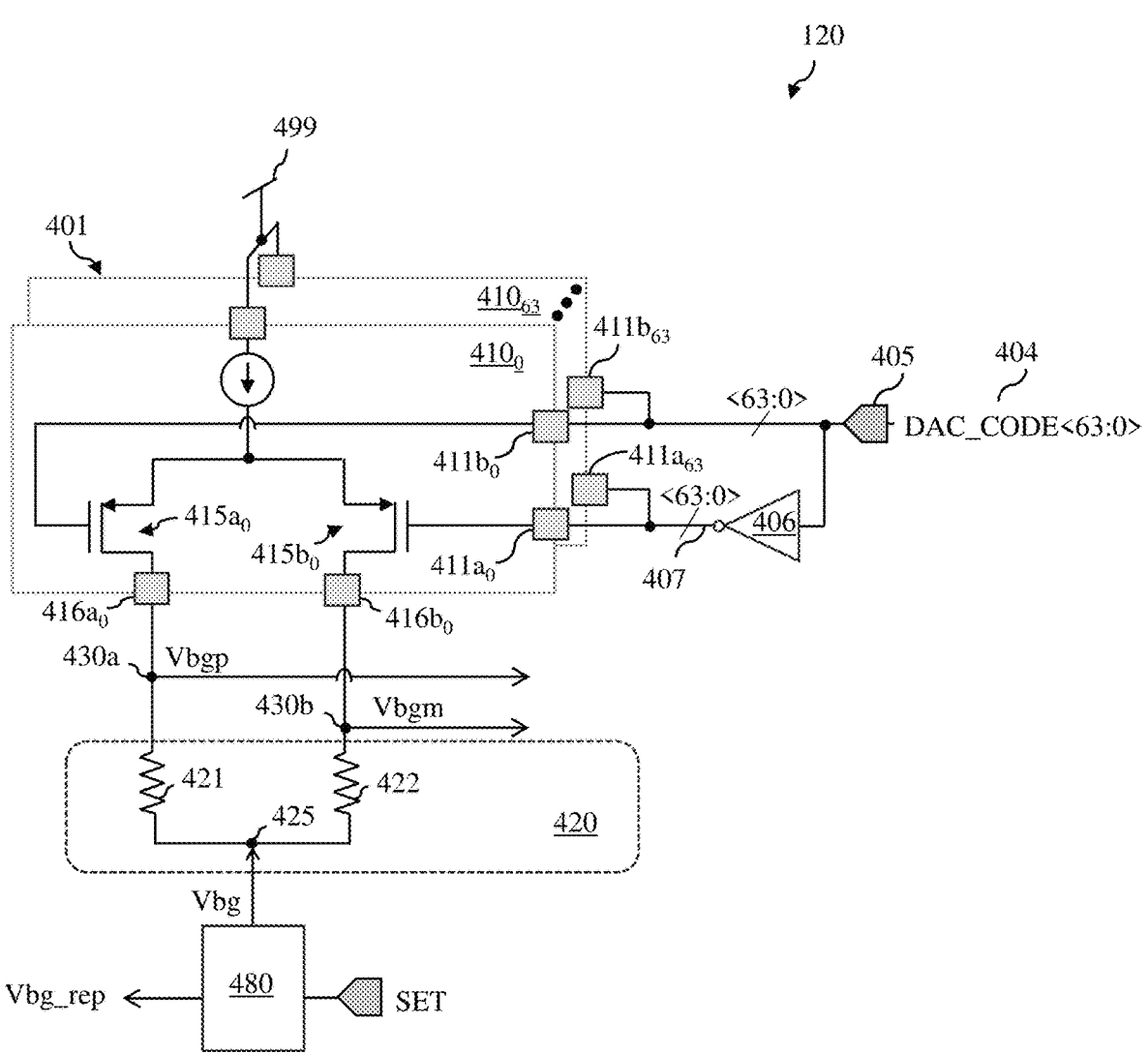
FIG. 4 is a schematic diagram illustrating an example of a back gate bias voltage generator that can be incorporated into the RF circuit of FIG. 1.
Figure 5:
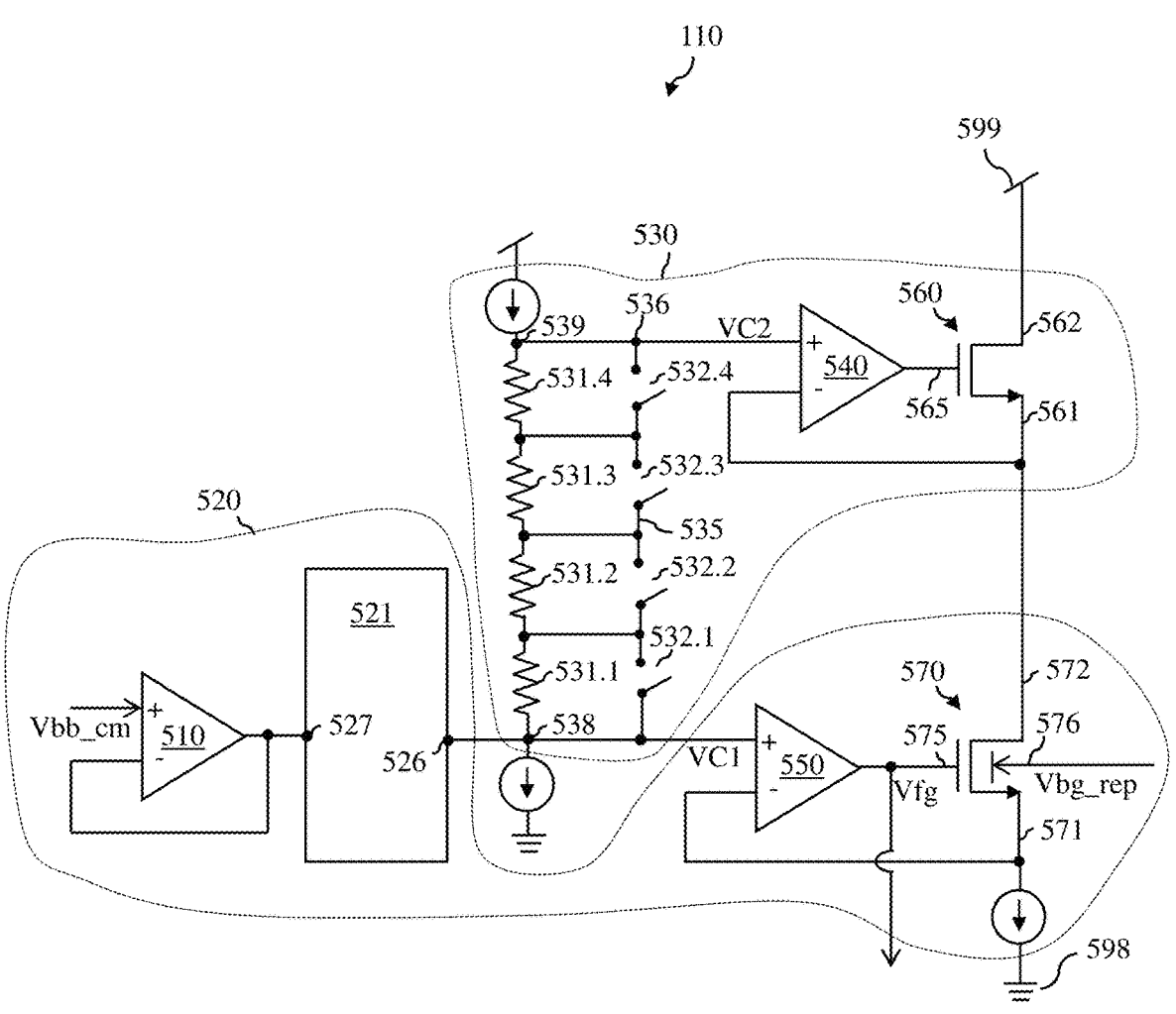
FIG. 5 is a schematic diagram illustrating an example of a front gate bias voltage generator that can be incorporated into the RF circuit of FIG. 1.

FIG. 4 is a schematic diagram illustrating an example of a back gate bias voltage generator 120 that could be incorporated into RF circuit 100 and FIG. 5 is a schematic diagram illustrating an example of a front gate bias voltage generator 110 that could be incorporated into RF circuit 100.

Referring to FIG. 4, back gate bias voltage generator 120 can include, for example, a current steering digital-to-analog converter (DAC) 401 with multiple DAC units each connected to a pair of back gate bias voltage output nodes 430a and 430b for outputting Vbgp and Vbgm, respectively. For example, DAC 401 can include sixty-four DAC units ($410_0$-$410_{63}$). It should be understood that this number (e.g., sixty-four) of DAC units is provided for illustration purposes and is not intended to be limiting. In any case, each DAC unit $410_0$-$410_{63}$ can include a corresponding pair of DAC unit input nodes $411a_0$-$411a_{63}$, $411b_0$-$411b_{63}$ and a corresponding pair of DAC unit output nodes $416a_0$-$416a_{63}$, $416b_0$-$416b_{63}$. Each DAC unit $410_0$-$410_{63}$ can further include a corresponding pair of P-channel field effect transistors (PFETs) $415a_0$-$415a_{63}$, $415b_0$-$415b_{63}$. It should be understood that to avoid clutter in the drawing only the corresponding pair of PFETs $415a_0$ and $415b_0$ of DAC unit $410_0$ are illustrated in FIG. 4. The pair of PFETs $415a_0$-$415a_{63}$, $415b_0$-$415b_{63}$ in each DAC unit $410_0$-$410_{63}$ can have source regions connected to a positive supply voltage rail 499, drain regions connected to the corresponding pair of DAC unit output nodes $416a_0$-$416a_{63}$, $416b_0$-$416b_{63}$ for the DAC unit and gates connected to the corresponding pair of DAC unit input nodes $411a_0$-$411a_{63}$, $411b_0$-$411b_{63}$, respectively.

DAC 401 can further include a sixty-four bit wide DAC input bus 405 (i.e., one bit for each DAC unit). DAC input bus 405 can be connected to receive a DAC input code 404 (i.e., DAC_CODE<63:0>) (e.g., from a controller). DAC input bus 405 can be connected to apply corresponding bits of DAC input code 404 to DAC unit input nodes $411b_0$-$411b_{63}$ of DAC units $410_0$-$410_{63}$, respectively, and thereby to the gates of PFETs $415b_0$-$415b_{63}$ therein. DAC 401 can further include an inverter 406 also connected to receive DAC input code 404 (i.e., DAC_CODE <63:0>). Inverter 406 can receive DAC input code 404 and output an inverted DAC input code 407. Inverter 406 can further be connected to apply corresponding bits of the inverted DAC input code 407 to DAC unit input nodes $411a_0$-$411a_{63}$ of DAC units $410_0$-$410_{63}$, respectively, and thereby to the gates of PFETs $415a_0$-$415a_{63}$ therein.

DAC 401 can further include a pair of back gate bias voltage output nodes 430a and 430b. Back gate bias voltage output node 430a can be connected to output nodes $416a_0$-$416a_{63}$ of DAC units $410_0$-$410_{63}$ and thereby to drain regions of PFETs $415a_0$-$415a_{63}$ therein. Back gate bias voltage output node 430b can be connected to output nodes $416b_0$-$416b_{63}$ of $410_0$-$410_{63}$ and thereby to drain regions of PFETs $415b_0$-$415b_{63}$ therein. As a result, in response to DAC input code 404, the back gate bias voltage generator can generate and output a first back gate bias voltage (Vbgp) at back gate bias voltage output node 430a and can further generate and output a second back gate bias voltage (Vbgm) at back gate bias voltage output node 430b.

DAC input code 404 can be pre-determined to achieve a specific offset voltage (ΔV) between Vbgp and Vbgm by controlling the logic levels of the bits/inverted bits applied to the gates of the PFETs in each of the DAC units. For example, the ΔV achieved with DAC_CODE setting 31 is zero, which means the left and right sides are balanced (i.e., Vbgp and Vbgm are equal), whereas the ΔV achieved with other DAC settings are at some level above or below zero, which means the left and right sides are off-balance (i.e., Vbgp is not equal to Vbgm). The optimal offset (ΔV) between Vbgp and Vbgm and, thus, the DAC input code 404, can be determined (e.g., at the factory level) by measuring mixer BBout while using a nominal Vfg and sweeping through available DAC programming levels for ΔV for a given range of potential back gate bias voltages to achieve the best results (i.e., to best improve second order non-linearity of mixer 130).

Back gate bias voltage generator 120 can further include an additional voltage divider 420 and an additional back gate bias voltage setting component 480, which is connected to additional voltage divider 420 and further to front gate bias voltage generator 110. Additional voltage divider 420 can include two resistors 421-422 connected in series between back gate bias voltage output nodes 430a-430b. Additional back gate bias voltage setting component 480 can be connected to receive a back gate bias voltage control signal (SET) (e.g., from a controller, not shown). Additional back gate bias voltage setting component 480 can further be configured to generate and output another pair of back gate bias voltages including a common mode back gate bias voltage (Vbg) and an additional back gate bias voltage (Vbg_rep) based on SET. Vbg can specifically be output to a center node 425 in additional voltage divider 420 (i.e., at the junction between series-connected resistors 421 and 422). As a result, Vbgp on back gate bias voltage output node 430a will be essentially equal to Vbg on center node 425 plus the voltage drop over resistor 421 and Vbgm on back gate bias voltage output node 430b will be essentially equal to Vbg on center node 425 plus the voltage drop over resistor 422. Vbg_rep can, for example, be generated so that it is essentially equal to the average of the back gate bias voltages applied to the back gates 316, 326, 336 and 346 of transistors 310, 320, 330, 340 within mixer 130. Thus, Vbg_rep will be equal to or slightly different than Vbg (e.g., Vbg_rep~Vbg, plus or minus some minimal amount). As discussed in greater detail below, Vbg_rep can specifically be output to the back gate 576 of a replica transistor 570 in the front gate bias voltage generator 110. Various voltage setting components (also referred to as voltage generators) suitable for setting voltages based on control signal(s) are known in the art Thus, the details of additional back gate bias voltage setting component 480 have been omitted from the specification in order to allow the reader to focus on the salient aspects of the disclosed embodiments (e.g., related to mixer structure and operation).

Referring to FIG. 5, front gate bias voltage generator 110 can include a front gate bias voltage setting section 520 and a drain-source voltage setting section 530.

Front gate bias voltage setting section 520 can set Vfg (i.e., can be configured to set Vfg) by tracking Vbb_cm to achieve optimal mixer performance. Vfg can, for example, be set to a level at or above the threshold voltage (VT) of the dual-gated NFETs 310, 320, 330, 340 within the mixer 130. Specifically, front gate bias voltage setting section 520 can include a fifth transistor 570. Fifth transistor 570 is also referred to herein as a replica transistor as its function is to replicate the performance of transistors 310, 320, 330, and 340 of mixer 130. Fifth transistor 570 can be yet another dual-gated NFET, which is configured in essentially the same manner as dual-gated NFET 10 of FIG. 2, as described in detail above. Fifth transistor 570 can include, amongst other components: a fifth source region 571, which is connected to ground; a fifth drain region 572; a fifth front gate 575, which is connected to receive Vfg; and a fifth back gate 576. Fifth back gate 576 can be connected to receive Vbg_rep from back gate bias voltage generator 120. As mentioned above, Vbg_rep can be selectively set by additional back gate bias voltage setting component 480, based on Vbg and as controlled by SET Vbg_rep, so that it is essentially equal to the average of the back gate bias voltages applied to back gates 316, 326, 336 and 346 of transistors 310, 320, 330, 340 within mixer 130. Such a Vbg_rep ensures that the condition of fifth transistor 570 matches the condition of transistors 310, 320, 330, and 340 within mixer 130.

Front gate bias voltage setting section 520 can further include a first operational amplifier 550. First operational amplifier 550 can include: a first non-inverting input; a first inverting input, which is connected to fifth source region 571 of fifth transistor 570; and a first operational amplifier output that outputs Vfg and is connected to fifth front gate 575 of the fifth transistor 570.

Front gate bias voltage setting section 520 can further include a voltage adjustment circuit 521. Optionally, voltage adjustment circuit 521 can be a digitally controlled voltage adjustment circuit. Voltage adjustment circuit 521 can include a common mode baseband voltage input node 527 and a first control voltage output node 526. Voltage adjustment circuit 521 can, for example, receive Vbb_cm as an input on the common mode baseband voltage input node 527. Voltage adjustment circuit 521 can further generate and output a first control signal (VC1) (i.e., can be configured to generate and output VC1) on first control signal output node 525 in response to digital control signals (e.g., from a controller). Thus, VC1 tracks Vbb_cm and, more specifically, depending upon the digital control signals, VC1 can be the same as Vbb_cm, greater than Vbb_cm, or lower than Vbb_cm. Various different configurations for digitally-controlled voltage adjustment circuits (which can output an output voltage signal that is equal to, lower than, or greater than an input voltage signal) are well known in the art. Thus, the details thereof have been omitted from the specification in order to allow the reader to focus on the salient aspects of the disclosed embodiments.

In any case, as illustrated, first control voltage output node 526 can be electrically connected to the first non-inverting input of first operational amplifier 550 so that Vfg is dependent on the difference between VC1 and the source voltage of fifth transistor 570. Thus, calibration of Vfg for optimal mixer performance can be achieved by adjusting VC1 relative to Vbb_cm, as needed. In some embodiments, calibration Vfg can be performed at the factory level with the digital control signals for voltage adjustment circuit 521 being pre-set for subsequent operational use. In other embodiments, calibration could optionally also be performed periodically during operational use to re-calibrate Vfg for optimal performance.

It should be noted that Vbb_cm can be output by voltage divider 360 of mixer 130. In some embodiments, Vbb_cm can be received at the common mode baseband voltage input node 527 directly from mixer 130. In other embodiments, as illustrated, front gate bias voltage setting section 520 can further include a second operational amplifier 510 with a second non-inverting input connected to receive Vbb_cm from mixer 130, with a second inverting input, and a second operational amplifier connected back to the second inverting input (e.g., so second operational amplifier 510 has negative feedback) and further connected to the common mode baseband voltage input node 527. Those skilled in the art will recognize that with this negative feedback configuration, second operational amplifier 510 will output Vbb_cm to common mode baseband voltage input node 527.

Drain-source voltage setting section 530 can be configured to set the drain-source voltage of fifth transistor 570 (i.e., of the replica transistor) so that it approximately matches the drain-source voltages of the dual-gated NFETs 310, 320, 330, 340 of mixer 130. Specifically, drain-source voltage setting section 530 can include series-connected resistors 531.1-531.4 between first and second end terminals 538-539. First and second end terminals 538-539 can be electrically connected to the ground rail 598 and the positive supply voltage rail 599, respectively. For purposes of illustration, four series-connected resistors 531.1-531.4 are illustrated in FIG. 5. However, it should be understood that the figures are not intended to be limiting and that, alternatively, any number of two or more series-connected second resistors could be employed. First end terminal 538 can further be electrically connected to first control voltage output node 526 for receiving first control voltage (VC1) and a second end terminal 539 can be electrically connected to second control voltage output node 536 for outputting a second control voltage (VC2), as discussed in greater detail below.

Drain-source voltage setting section 530 can further include a bypass path 535 extending between and electrically connected to the first and second end terminals 538-539. Junctions between pairs of adjacent resistors of the series-connected resistors 531.1-531.4 can be electrically connected to bypass path 535. Drain-source voltage setting section 530 can further include a set of bypass switches 532.1-532.4 within bypass path 535. These bypass switches 532.1-532.4 can be selectively operable to set/adjust VC2, which is output at second control voltage output node 536 and dependent on VC1.

Drain-source voltage setting section 530 can further include sixth transistor 560. Sixth transistor 560 and fifth transistor 570 can be electrically connected in series between positive supply voltage rail 599 and the ground rail 598. More specifically, sixth transistor 560 can be yet another NFET and can include: a sixth source region 561, which is electrically connected to fifth drain region 572 of fifth transistor 570; and a sixth drain region 562, which is electrically connected to positive supply voltage rail 599.

Drain-source voltage setting section 530 can further include a third operational amplifier 540. The third operational amplifier 540 can including: a third non-inverting input, which is electrically connected to receive VC2; a third inverting input, which is electrically connected to sixth source region 561 of sixth transistor 560; and a third operational amplifier output, which is electrically connected to a sixth front gate 565 of sixth transistor 560. Thus, sixth transistor 560 will be controlled by the output signal from third operational amplifier 540 (and, thereby dependent on the difference between VC2 and the source voltage of sixth transistor 560) and can be employed to set the drain-source voltage of fifth transistor 570.

By including both front gate bias voltage setting section 520 and drain-source voltage setting section 530, front gate bias voltage generator 110 is effectively configured to enable setting of Vfg using a replica transistor under the same operating conditions as the operating conditions of the dual-gated NFETs 310, 320, 330, 340.

FIG. 6 is a flow diagram illustrating disclosed operating method embodiments associated with RF circuit 100. Specifically, the method can include providing an RF circuit 100 including a down-conversion mixer 130 with dual-gated NFETs 310, 320, 330, 340, as described in detail above and illustrated in FIGS. 1-5 (see process 602). The method can further include operating RF circuit 100 including operating mixer 130.

Operation of mixer 130 can include using a differential local oscillator input signal (LOin) to down-convert a received high-frequency differential radio frequency input signal (RFin) to a low-frequency differential baseband output signal (BBout) (see process 604).

Operation of mixer 130 can also include, during process 604, front gate biasing dual-gated NFETs 310, 320, 330, 340 with a front gate bias voltage (Vfg) (process 606). Front gate biasing at process 604 with a specific Vfg can, for example, be performed to control mixer performance (e.g., to optimize the LO switching point of the mixer 130, etc.).

Operation of mixer 130 can also include, during process 604, back gate biasing dual-gated NFETs 310, 320, 330, 340 using a combination of two back gate bias voltages including a first back gate bias voltage (Vbgp) and a second back gate bias (Vbgm) (see process 608). The back gates of half of the dual-gated NFETs (e.g., for first transistor 310 and second transistor 320) within mixer 130 can be biased with Vbgp and the back gates of the other half of the dual-gate NFETs (e.g., third transistor 330 and fourth transistor 340) can be biased with Vbgm. Vbgp and Vbgm can specifically be pre-programmed (e.g., DAC-controlled) to achieve a desired voltage offset (ΔV) (i.e., Vbgp-Vbgm) in order to improve second order non-linearity of mixer 130. Additionally, those skilled in the art will recognize that typically, in dual-gate FETs formed using advanced semiconductor-on-insulator processing technologies (e.g., in dual-gated FDSOI FETs) back gate control is less sensitive than front gate control. Thus, the back gate calibration technique employed in the disclosed embodiments for IP2 calibration is less sensitive and, thus, more easily reproducible than with the front gate calibration techniques employed for IP2 calibration in prior art mixers.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
a mixer including: a first transistor connected between a first input node and an output node; a second transistor connected between an additional first input node and the output node; a third transistor connected between the first input node and an additional output node; and a fourth transistor connected between the additional first input node and the additional output node,
wherein a first front gate of the first transistor, a second front gate of the second transistor, a third front gate of the third transistor, and a fourth front gate of the fourth transistor are connected to receive a front gate bias voltage,
wherein a first back gate of the first transistor and a second back gate of the second transistor are connected to receive a first back gate bias voltage, and
wherein a third back gate of the third transistor and a fourth back gate of the fourth transistor are connected to receive a second back gate bias voltage different from the first back gate bias voltage.

2. The circuit of claim 1, wherein the mixer further includes:
a differential radio frequency input port connected to apply complementary radio frequency input signals of a differential radio frequency input signal to the first input node and the additional first input node;
a second input node;
an additional second input node;
a differential local oscillator input port connected to apply complementary local oscillator input signals of a differential local oscillator input signal to the second input node and the additional second input node, respectively;
a first capacitor having one first capacitor plate connected to the second input node and another first capacitor plate connected to the first front gate of the first transistor and the fourth front gate of the fourth transistor; and a second capacitor having one second capacitor plate connected to the additional second input node and another second capacitor plate connected to the second front gate of the second transistor and the third front gate of the third transistor.

3. The circuit of claim 1, further comprising a back gate bias voltage generator connected to receive an input code from a controller to program the first back gate bias voltage and the second back gate bias voltage to achieve a specific voltage offset, wherein, based on the input code, the back gate bias voltage generator generates and outputs the first back gate bias voltage and the second back gate bias voltage with the specific voltage offset.

4. The circuit of claim 1, further comprising a back gate bias voltage generator connected to receive an input code from a controller to program the first back gate bias voltage and the second back gate bias voltage to adjust second order non-linearity of the mixer, wherein, based on the input code, the back gate bias voltage generator generates and outputs the first back gate bias voltage and the second back gate bias voltage to adjust the second order non-linearity of the mixer.

5. The circuit of claim 1, wherein the mixer further includes a voltage divider connected to the output node and the additional output node and wherein the voltage divider outputs a common mode baseband voltage.

6. The circuit of claim 1, wherein the mixer further includes a differential baseband output port connected to the output node and the additional output node.

7. The circuit of claim 1, wherein the first transistor, the second transistor, the third transistor, and the fourth transistor include dual-gated N-channel field effect transistors.

8. A circuit comprising:
a front gate bias voltage generator outputting a front gate bias voltage;
a back gate bias voltage generator outputting a first back gate bias voltage and a second back gate bias voltage; and
a mixer including: a first transistor connected between a first input node and an output node; a second transistor connected between an additional first input node and the output node; a third transistor connected between the first input node and an additional output node; and a fourth transistor connected between the additional first input node and the additional output node,
wherein a first front gate of the first transistor, a second front gate of the second transistor, a third front gate of the third transistor, and a fourth front gate of the fourth transistor are connected to receive the front gate bias voltage,
wherein a first back gate of the first transistor and a second back gate of the second transistor are connected to receive the first back gate bias voltage,
wherein a third back gate of the third transistor and a fourth back gate of the fourth transistor are connected to receive the second back gate bias voltage, and
wherein the first back gate bias voltage and the second back gate bias voltage are different and programmed to adjust second order non-linearity of the mixer.

9. The circuit of claim 8, wherein the mixer further includes:
a differential radio frequency input port connected to apply complementary radio frequency input signals of a differential radio frequency input signal to the first input node and the additional first input node;
a second input node;
an additional second input node;

a differential local oscillator input port connected to apply complementary local oscillator input signals of a differential local oscillator input signal to the second input node and the additional second input node, respectively;

a first capacitor having one first capacitor plate connected to the second input node and another first capacitor plate connected to the first front gate of the first transistor and the fourth front gate of the fourth transistor; and a second capacitor having one second capacitor plate connected to the additional second input node and another second capacitor plate connected to the second front gate of the second transistor and the third front gate of the third transistor.

10. The circuit of claim 8, wherein the mixer further includes a voltage divider that outputs a common mode baseband voltage, and wherein the back gate bias voltage generator includes:

back gate bias voltage output nodes, wherein the back gate bias voltage generator generates and outputs the first back gate bias voltage and the second back gate bias voltage on the back gate bias voltage output nodes, respectively, to achieve a specific voltage offset equal to a difference between the first back gate bias voltage and the second back gate bias voltage;

an additional voltage divider including two resistors connected in series between the back gate bias voltage output nodes; and an additional back gate bias voltage setting component connected to output a common mode back gate bias voltage to a center node between the two resistors and to output an additional back gate bias voltage to the front gate bias voltage generator.

11. The circuit of claim 10, wherein the front gate bias voltage generator includes:

a front gate bias voltage setting section including a fifth transistor, wherein the front gate bias voltage setting section generates and outputs the front gate bias voltage, wherein a fifth front gate of the fifth transistor is connected to receive the front gate bias voltage, and wherein a fifth back gate of the fifth transistor is connected to receive the additional back gate bias voltage; and a drain-source voltage setting section connected to front gate bias voltage setting section, wherein the drain-source voltage setting section sets a drain-source voltage of the fifth transistor.

12. The circuit of claim 11, wherein the front gate bias voltage setting section further includes:

a first operational amplifier including: a first non-inverting input; a first inverting input connected to a fifth source region of the fifth transistor; and a first operational amplifier output that outputs the front gate bias voltage and is connected to a fifth front gate of the fifth transistor; and a voltage adjustment circuit including a common mode baseband voltage input node connected to receive the common mode baseband voltage and a first control voltage output node electrically connected to the first non-inverting input of the first operational amplifier, wherein the voltage adjustment circuit is controllable to output the first control voltage to the first control voltage output node based on the common mode baseband voltage.

13. The circuit of claim 12, wherein the common mode baseband voltage input node is connected to receive the common mode baseband voltage from the mixer.

14. The circuit of claim 12, wherein the front gate bias voltage setting section further includes a second operational amplifier with negative feedback and having a second non-inverting input connected to receive the common mode baseband voltage from the mixer, and wherein the common mode baseband voltage input node is connected to receive the common mode baseband voltage from the second operational amplifier.

15. The circuit of claim 12, wherein the drain-source voltage setting section includes:

series-connected resistors between a first end terminal and a second end terminal, wherein the first end terminal is connected to the first control voltage output node and wherein the second end terminal is connected to a second control voltage output node;

a bypass path extending between the first end terminal and the second end terminal, wherein junctions between pairs of adjacent resistors of the series-connected resistors are connected to the bypass path;

bypass switches within the bypass path, wherein the bypass switches are selectively operable to adjust a second control voltage at the second control voltage output node;

a sixth transistor, wherein the sixth transistor and the fifth transistor are connected in series between a positive supply voltage rail and ground; and a third operational amplifier including: a third non-inverting input connected to receive the second control voltage; a third inverting input connected to a sixth source region of the sixth transistor; and a third operational amplifier output connected to a sixth front gate of the sixth transistor.

16. The circuit of claim 15, wherein the first transistor, the second transistor, the third transistor, the fourth transistor, the fifth transistor, and the sixth transistor include N-channel field effect transistors.

\* \* \* \* \*